(12) United States Patent
Rastegar

(10) Patent No.: US 10,186,713 B2
(45) Date of Patent: Jan. 22, 2019

(54) HEAT SUPPLY FOR THERMAL BATTERY AND THERMAL BATTERY HAVING THE HEAT SUPPLY

(71) Applicant: Jahangir S Rastegar, Stony Brook, NY (US)

(72) Inventor: Jahangir S Rastegar, Stony Brook, NY (US)

(73) Assignee: OMNITEK PARTNERS LLC, Ronkonkoma, NY (US)

( * ) Notice: Subject to any disclaimer, the term of this patent is extended or adjusted under 35 U.S.C. 154(b) by 12 days.

(21) Appl. No.: 15/642,297

(22) Filed: Jul. 5, 2017

(65) Prior Publication Data

US 2018/0013152 A1 Jan. 11, 2018

Related U.S. Application Data

(60) Provisional application No. 62/359,152, filed on Jul. 6, 2016.

(51) Int. Cl.
*H01M 6/00* (2006.01)
*H01M 6/36* (2006.01)
*H01L 41/083* (2006.01)
*F42C 11/00* (2006.01)

(52) U.S. Cl.
CPC ............. *H01M 6/36* (2013.01); *F42C 11/008* (2013.01); *H01L 41/083* (2013.01); *H01M 2220/20* (2013.01)

(58) Field of Classification Search
CPC ....................................................... H01M 6/00
See application file for complete search history.

(56) References Cited

U.S. PATENT DOCUMENTS

2014/0272504 A1* 9/2014 Edington ................ H01M 6/36
429/94

* cited by examiner

Primary Examiner — Jacob B Marks

(57) ABSTRACT

A thermal battery including: a casing; a battery cell disposed in the casing; a heat generating pyrotechnic material, separate from the battery cell, at least partially surrounding the battery cell; and insulation disposed between the heat generating pyrotechnic material and the casing, wherein the heat generating pyrotechnic material is disposed in a flattened tube having a flat cross-section where at least two sides are substantially parallel, the flattened tube being spirally wound to form a shape corresponding to a complimentary shape of at least a portion of the battery cell.

7 Claims, 2 Drawing Sheets

118

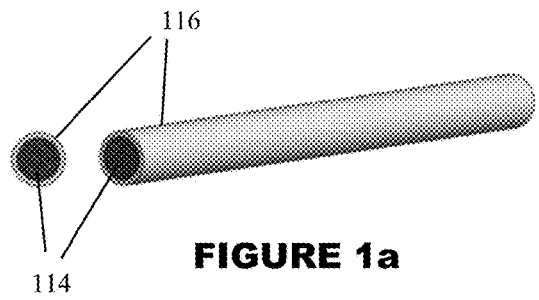
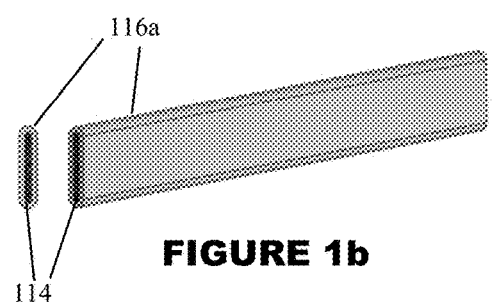
FIGURE 1a   FIGURE 1b
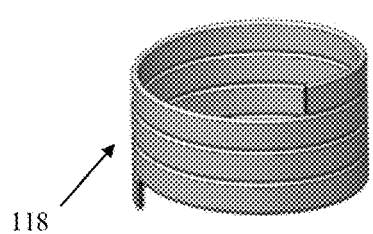
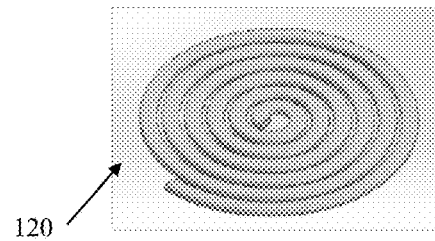
FIGURE 1c   FIGURE 1d
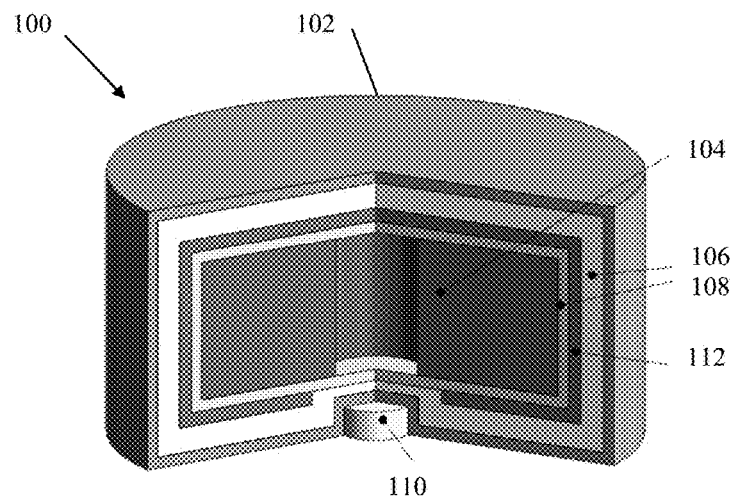
FIGURE 2

HEAT SUPPLY FOR THERMAL BATTERY AND THERMAL BATTERY HAVING THE HEAT SUPPLY

CROSS-REFERENCE TO RELATED APPLICATIONS

This application claims benefit to U.S. Provisional Application No. 62/359,152, filed on Jul. 6, 2016, the entire contents of which is incorporated herein by reference.

This application is related to U.S. patent application Ser. No. 15/060,818, corresponding to U.S. Patent Application Publication No. 2017-0040619, filed on Mar. 4, 2016, the contents of which is incorporated herein by reference.

BACKGROUND

1. Field of the Invention

The present invention relates to thermal batteries, and more particularly to a heat supply for thermal batteries, which may also be a hybrid thermal battery, and to methods of their fabrication and use.

2. Prior Art

Thermal batteries are primary reserve electrochemical power sources in which the electrolyte is solid and non-conducting at room ambient temperatures. Upon ignition of an integral pyrotechnic heat source adjacent to each cell, the electrolyte melts and becomes conductive. The battery is then capable of providing power to an external load, as long as the electrolyte stays molten or until depletion of the active material, typically from a few seconds to an hour.

Thermal batteries have many advantages over other battery systems. Since all internal components are immobilized solids at ambient temperatures, the units are inherently rugged. They can withstand severe environments of shock, vibration, acceleration, spin, altitude and temperature. Because they are hermetically sealed they can withstand long term storage, typically well over 20 years, and still provide immediate power upon activation. Thermal batteries are maintenance free and can be permanently installed.

Thermal batteries present an interesting solution given their inherent environmentally and electrically safe design, long shelf life, and zero maintenance. Thermal batteries are therefore a promising technology for fuze power. Thermal batteries have been extensively developed in the United States and represent a stronger industrial base than a liquid reserve battery alternative. While the thermal battery technology presents many advantages as a reserve battery, there are technological challenges impeding their application in some military electrical fuzing applications.

Reserve thermal batteries are a single use, high temperature, galvanic primary cell battery. These batteries have been demonstrated to be environmentally safe and have a long shelf life which is ideal for military purposes. Thermal battery composition allows it to withstand the severe environment of gun ammunition, particularly acceleration, shock, vibration, and spin. They are reliable, safe, have relatively fast activation, do not require maintenance, have chemicals which are inert until activated, and are designed to facilitate power or capacity improvements. The high conductivity of the electrolyte at high temperatures allows the battery to be discharged at high rates. Thermal battery applications and characteristics allow designs to meet specific electrical and environmental parameters. Thermal batteries present a favorable solution given their inherent environmentally and electrically safe design, long shelf life, and zero maintenance for the indicated applications.

The fundamental building block of every thermal battery is the cell. Each cell basically consists of four components: an anode, electrolyte, a cathode and a pyrotechnic heat source. Cells are commonly circular in shape, like coins of various diameters and thicknesses. Once heated to operating temperature, each cell provides approximately 2 volts (lithium compound anode and metal sulfide cathode).

By stacking these cells to form a series cell stack, any desired voltage level is obtained. Electrical connections to external sources are made through battery terminal pins. Internally, these pins are spot welded to metal leads that run along the edge of the cell stack and connect to metal collector discs at each end. Multiple voltage levels can be obtained by inserting collector discs between any cells within the stack. Increasing the cell area, either by enlarging the cell diameter or connecting cell stacks in parallel, increases the battery's ability to meet system current demands. Battery active life is regulated through both quantities of reactive material and thermal management techniques.

They are several ways to activate thermal batteries: the most common activation methods are electrical and mechanical inertial igniters. In each method, the activation device produces a flame or hot particles to ignite the pyrotechnic heat sources located in the battery, thus raising the internal battery temperature to its operating level.

Ammunition fuze electrical requirements vary, such as a nominal voltage of 5.6 to 12 V, current draw of up to 325 mA, runtime of 200 seconds, and a rise time of less than 10 ms with a standard deviation of about 1 ms. Typically, during the first 10 seconds following launch, the fuzing power requirement is lower, such as 35 mA at 5.6 V. During the first 500 msec following launch, the power requirement is even lower, such as 5 mA at 3 V.

For a wide range of munitions power source applications, current thermal battery technology faces a number of significant challenges that need to be addressed. Two of the main challenges facing current thermal battery technology are related to their relatively long rise time and to their relatively short run time for what is usually a relatively small volume requirement, such as 15-20 cubic centimeters.

Thermal battery rise time is directly proportional to its size and is lower for smaller size batteries. However, even for a relatively small battery of 15-20 cubic centimeters in volume, current technology cannot usually achieve the required rise time, such as 10 msec. Thermal batteries are initiated through ignition of their pyrotechnic layers (pyrotechnic heat sources) between the battery cells to provide the heat that is required to melt the battery solid electrolyte. The process of igniting the entire pyrotechnic layers, melting the electrolytes and bringing the battery to its minimum operating temperature level takes a relatively long time. For relatively small batteries, for example on the order of 0.5 to 0.75 inch diameter batteries, the time that will take to bring a current thermal battery, i.e., its rise time, may be at least 50-100 milliseconds.

On the other hand, smaller thermal batteries have a shorter run time due to smaller thermal mass of their battery core (which is proportional to its volume) relative to their surface area through which they lose the stored heat. As a simple example, for cubic battery cores with sides of 1, 2 and 5 inches; their volumes will be 1, 8 and 125 cubic inches, respectively; while their surface areas are 6, 24 and 150, respectively. As a result, the ratio of their surface area to their volume become 6, 3 and 1.2, respectively. This simple example shows why smaller thermal batteries have significantly shorter run time than larger thermal batteries.

Thus, thermal battery rise time is inversely proportional to their size while their run time, which is dependent on maintaining their elevated operating temperature, is directly proportional to their size. For most munitions applications, relatively small size and long run time presents conflicting requirements as the reserve battery is required to rise to operating voltage very quickly and precisely while providing power for the relatively long time of flight. As a result, a large battery that might provide for the flight time would fail the rise time and volume allocation requirement. However, a very small battery might address the rise time and volume allocation requirement but would fail the power run time requirements. Currently, thermal batteries with a volume of 15-20 cubic centimeters cannot be designed to provide electrical power longer than around 50 seconds.

What is needed are reserve power sources that can be designed to provide very fast rise times, such as on the order of 1-10 milliseconds, as well as long run times in relatively small volumes.

SUMMARY

Accordingly, a thermal battery is provided. The thermal battery comprising: a casing; a battery cell disposed in the casing; a heat generating pyrotechnic material, separate from the battery cell, at least partially surrounding the battery cell; and insulation disposed between the heat generating pyrotechnic material and the casing; wherein the heat generating pyrotechnic material is disposed in a flattened tube having a flat cross-section where at least two sides are substantially parallel, the flattened tube being spirally wound to form a shape corresponding to a complimentary shape of at least a portion of the battery cell.

The shape can be one or more of a cylindrical shape and a flat shape.

The thermal battery can further comprise a piezoelectric generator disposed in a portion of the casing.

Also provided is a heat supply for encasing at least a portion of a thermal battery cell. The heat supply comprising: a flattened tube having a flat cross section in which at least two sides are substantially parallel; and a heat generating pyrotechnic material disposed in an interior of the flattened tube; wherein the flattened tube being spirally wound to form a shape corresponding to a complimentary shape of at least a portion of the battery cell.

The shape can be one or more of a cylindrical shape and a flat shape.

Still further provided is a method for fabricating a heat supply for encasing at least a portion of a thermal battery. The method comprising: filling a tube with a heat generating pyrotechnic material; flattening a cross section of the tube such that at least two sides are substantially parallel; and spirally winding the flattened tube to form a shape corresponding to a complimentary shape of at least a portion of the battery cell.

The flattened tube can be spirally wound in one or more of a cylindrical shape and a flat shape.

BRIEF DESCRIPTION OF THE DRAWINGS

These and other features, aspects, and advantages of the apparatus of the present invention will become better understood with regard to the following description, appended claims, and accompanying drawings where:

FIGS. 1a-1d illustrate a process of fabricating heating fuse strips for use a hybrid power source.

FIG. 2 illustrates an embodiment of a hybrid power source.

DETAILED DESCRIPTION OF THE PREFERRED EMBODIMENT

Figure 3:
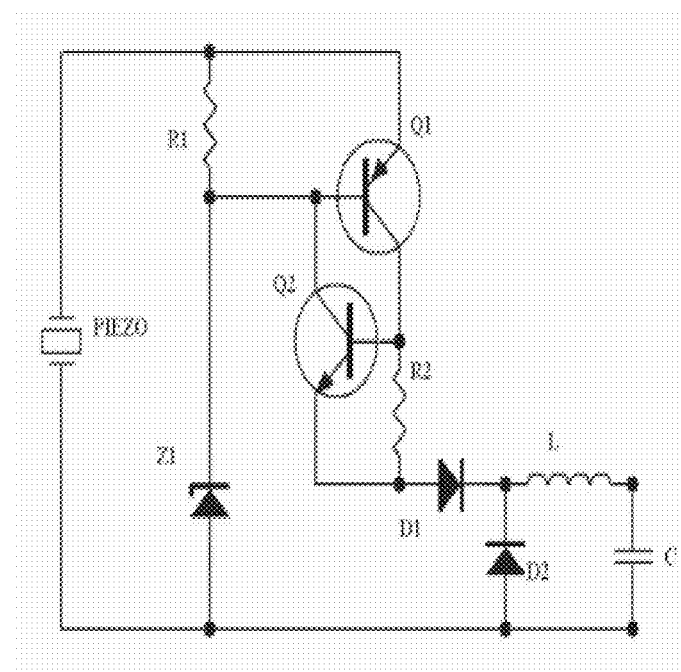
FIG. 3 illustrates a diagram of the safety and firing event detection electronics and logic circuitry for integration into the hybrid power source of FIG. 2.

FIGS. 1a-1d illustrate a process for fabricating a heat supply, such as a heat generating fuse strip for use in a thermal battery where the heat generating fuse strip occupies a relatively small volume in an interior of the thermal battery. A thermal battery that may make use of such heat supply is illustrated in FIG. 2 and referred to generally by reference numeral 100. The thermal battery shown in FIG. 2 is a hybrid thermal battery similar to that disclosed in U.S. patent application Ser. No. 15/060,818, corresponding to U.S. Patent Application Publication No. 2017-0040619, filed on Mar. 4, 2016, the contents of which is incorporated herein by reference. However, the heat supply disclosed herein has application in other power sources and in thermal batteries that do not include the hybrid functionality discussed in U.S. Patent Application Publication No. 2017-0040619.

The thermal battery 100 includes a casing 102, a battery core (cell) 104 and one or more layers of thermal insulation 106, 108 disposed between the battery core 104 and the casing 102. A piezoelectric stack 110 may be provided as an inertial starter disposed in the casing for at least activating the thermal battery upon the casing experiencing a predetermined acceleration event. The thermal battery further having a heat supply 112, such as a heat generating pyrotechnic material, which is separate from the battery core 104, at least partially surrounding the battery core 104.

As discussed in U.S. Patent Application Publication No. 2017-0040619, providing a slow burning and heat generating heat supply, 112 that is wrapped around the thermal battery core that is initiated upon battery activation to keep the core above its operational temperature for an extended period of time, such as 200-300 seconds.

Such heat supply 112 can be a heat strip (alternatively referred to as a fuse strip) as shown in FIGS. 1c and 1d. A process for fabricating heat strips is shown in FIGS. 1a-1d. As shown in FIG. 1a, pyrotechnic material 114 is first compacted in an interior of a tube 116, which can be a thin wall aluminum tube. As shown in FIG. 1b, the tube 116 is flattened into a flattened tube 116a by any known process for flattening tubes, such as pressing or rolling, while maintaining the pyrotechnic material in the interior. The flattened tube 116a is then formed into spiral shapes, such as a cylindrical spiral shape 118 shown in FIG. 1c and/or a flat spiral shape 120 as shown in FIG. 1d, to cover around and/or top and bottom surfaces, respectively, of the battery core 104, as shown schematically in FIG. 2. Such forming methods for spirally winding tubes is well known in the art.

The flattened tube 116a being any tube that is processed to have a flat cross-section where at least two sides are substantially parallel, for example, as is shown in FIG. 1b. Also, the flattening of the tube can be performed either prior to or subsequent to the flattening, although the former is preferred.

Although shown completely surrounding the battery core 104 in FIG. 2, the heat supply 112 may be configured to partially surround such battery core 104. Furthermore, although shown to be disposed between heat insulation layers 106, 108, the heat supply 112 may be provided directly against the battery core 104 or in any configuration where heat from the heat supply 112 is transferred to the battery core 104 to increase rise and/or run time of the same.

The pyrotechnic material 114 can be a pyrotechnic compound that would burn slowly and reliably in a relatively thin layer in the thin walled flattened tubing 116a. In the thermal battery design shown in FIG. 2, the thickness of the flattened fuse strip can be about 1.1 mm. In such exemplary size, with a wall thickness of around 0.15-0.2 mm, leaves a pyrotechnic material 114 thickness of 0.7-0.8 mm, and a width of slightly less than 2 mm. It is, however, noted that by providing the heating fuse strip around the battery core, the required volume of the battery core is expected to be slightly reduced since regular core volumes are routinely oversized to provide the required heat mass to achieve as long a run time as possible.

If the thermal battery is a hybrid thermal battery, as is disclosed in U.S. Patent Application Publication No. 2017-0040619, the piezoelectric element 110 can make electrical power available to the fuze electronics within a predetermined time period, such as 8 msec with a standard deviation of 1 msec to 6.4 msec and standard deviation of 1.3 msec at 3 Volts and 5 mA power. Since the thermal battery can be activated within 45-50 msec, therefore the piezoelectric element 110 needs to provide power for around 40 msec, i.e., equivalent of around 600 micro-Joules.

The required piezoelectric volume that is required to provide 600 micro-J of electrical energy with a very conservative assumed mechanical to electrical energy efficiency of 40 percent and an added 10 percent margin was determined to be about 16 mm$^3$. The required piezoelectric (stack) element volume was determined through detailed modeling and testing of actual piezoelectric elements in shock loading simulator. A diagram of a safety and firing event detection electronics and logic circuitry is shown in FIG. 3. The piezoelectric element can be integrated into the power source as shown in FIG. 2 in a recess provided at the center of the battery bottom cap without requiring any reduction in the battery core volume.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A thermal battery comprising:
   a casing;
   a battery cell disposed in the casing;
   a heat generating pyrotechnic material, separate from the battery cell, at least partially surrounding the battery cell; and
   insulation disposed between the heat generating pyrotechnic material and the casing;
   wherein the heat generating pyrotechnic material is disposed in a flattened tube having a flat cross-section where at least two sides are substantially parallel, the flattened tube being spirally wound to form a shape corresponding to a complimentary shape of at least a portion of the battery cell.

2. The thermal battery of claim 1, wherein the shape is one or more of a cylindrical shape and a flat shape.

3. The thermal battery of claim 1, further comprising a piezoelectric generator disposed in a portion of the casing.

4. A heat supply for encasing at least a portion of a thermal battery cell, the heat supply comprising:
   a flattened tube having a flat cross section in which at least two sides are substantially parallel; and
   a heat generating pyrotechnic material disposed in an interior of the flattened tube;
   wherein the flattened tube being spirally wound to form a shape corresponding to a complimentary shape of at least a portion of the battery cell.

5. The heat supply of claim 4, wherein the shape is one or more of a cylindrical shape and a flat shape.

6. A method for fabricating a heat supply for encasing at least a portion of a thermal battery, the method comprising:
   filling a tube with a heat generating pyrotechnic material;
   flattening a cross section of the tube such that at least two sides are substantially parallel; and
   spirally winding the flattened tube to form a shape corresponding to a complimentary shape of at least a portion of the battery cell.

7. The method of claim 6, wherein the flattened tube is spirally wound in one or more of a cylindrical shape and a flat shape.

* * * * *